(12) United States Patent
Deshpande et al.

(10) Patent No.: US 12,106,822 B2
(45) Date of Patent: Oct. 1, 2024

(54) MEMORY ARRAY WITH PROGRAMMABLE NUMBER OF FILTERS

(71) Applicant: MEDIATEK Singapore Pte. Ltd., Singapore (SG)

(72) Inventors: Chetan Deshpande, San Jose, CA (US); Gajanan Sahebrao Jedhe, San Jose, CA (US); Gaurang Prabhakar Narvekar, San Jose, CA (US); Cheng-Xin Xue, Hsinchu (TW); Sushil Kumar, San Jose, CA (US); Zijie Guo, San Jose, CA (US)

(73) Assignee: MediaTek Singapore Pte. Ltd., Singapore (SG)

( * ) Notice: Subject to any disclaimer, the term of this patent is extended or adjusted under 35 U.S.C. 154(b) by 93 days.

(21) Appl. No.: 17/852,193

(22) Filed: Jun. 28, 2022

(65) Prior Publication Data

US 2023/0022347 A1 Jan. 26, 2023

Related U.S. Application Data

(60) Provisional application No. 63/222,487, filed on Jul. 16, 2021.

(51) Int. Cl.
 *G11C 7/10* (2006.01)
 *G06F 7/501* (2006.01)
 (Continued)

(52) U.S. Cl.
 CPC ............ *G11C 7/1069* (2013.01); *G06F 7/501* (2013.01); *G06F 7/5443* (2013.01);
 (Continued)

(58) Field of Classification Search
 CPC ................ G11C 7/1069; G11C 7/1012; G11C 7/1096; G11C 7/12; G11C 8/06; G11C 8/08;
 (Continued)

(56) References Cited

U.S. PATENT DOCUMENTS 6,005,813 A 12/1999 Waller et al.
7,355,873 B2 4/2008 Nii
(Continued)

FOREIGN PATENT DOCUMENTS

WO WO 2019/246064 A1 12/2019

OTHER PUBLICATIONS

Extended European Search Report for European Application No. 22167242.1 dated Sep. 7, 2022.
(Continued)

*Primary Examiner* — Mohammed A Bashar
(74) *Attorney, Agent, or Firm* — Winston Hsu

(57) ABSTRACT

Aspects of the present disclosure are directed to devices and methods for performing MAC operations using a memory array as a compute-in-memory (CIM) device that can enable higher computational throughput, higher performance and lower energy consumption compared to computation using a processor outside of a memory array. In some embodiments, an activation architecture is provided using a bit cell array arranged in rows and columns to store charges that represent a weight value in a weight matrix. A read word line (RWL) may be repurposed to provide the input activation value to bit cells within a row of bit cells, while a read-bit line (RBL) is configured to receive multiplication products from bit cells arranged in a column. Some embodiments provide multiple sub-arrays or tiles of bit cell arrays.

25 Claims, 14 Drawing Sheets

(51) Int. Cl.
*G06F 7/544* (2006.01)
*G11C 7/12* (2006.01)
*G11C 8/06* (2006.01)
*G11C 8/08* (2006.01)

(52) U.S. Cl.
CPC .......... *G11C 7/1012* (2013.01); *G11C 7/1096* (2013.01); *G11C 7/12* (2013.01); *G11C 8/06* (2013.01); *G11C 8/08* (2013.01)

(58) Field of Classification Search
CPC ................ G11C 7/1006; G11C 11/412; G11C 11/419; G11C 11/54; G06F 7/501; G06F 7/5443; G06N 3/0464; G06N 3/063
See application file for complete search history.

(56) References Cited

U.S. PATENT DOCUMENTS

| | | |
|---|---|---|
| 9,543,015 B1 | 1/2017 | Roy |
| 9,564,184 B2 | 2/2017 | Barth, Jr. |
| 10,534,839 B2 | 1/2020 | Hsieh |
| 10,621,489 B2 | 4/2020 | Appuswamy |
| 11,018,687 B1 | 5/2021 | Srivastava |
| 11,049,013 B1 | 6/2021 | Duong et al. |
| 2004/0199724 A1 | 10/2004 | Jalowiecki et al. |
| 2010/0271854 A1 | 10/2010 | Chu |
| 2013/0135914 A1 | 5/2013 | Kohli |
| 2015/0131383 A1* | 5/2015 | Akerib ................ G11C 13/004 365/189.011 |
| 2019/0102671 A1 | 4/2019 | Cohen et al. |
| 2020/0258569 A1 | 8/2020 | Jaiswal et al. |
| 2020/0301668 A1* | 9/2020 | Li ........................... G11C 11/54 |
| 2020/0403616 A1* | 12/2020 | Shu ...................... H03K 19/215 |
| 2021/0012202 A1 | 1/2021 | Venkatesh |
| 2021/0027815 A1* | 1/2021 | Shu ....................... G11C 11/412 |
| 2022/0328099 A1 | 10/2022 | Deshpande |
| 2023/0307017 A1 | 9/2023 | Jedhe |

OTHER PUBLICATIONS

Extended European Search Report for European Application No. 22185165.2 dated Dec. 12, 2022.

Yue et al., 14.3 A 65nm computing-in-memory-based CNN processor with 2.9-to-35.8 TOPS/W system energy efficiency using dynamic-sparsity performance-scaling architecture and energy-efficient inter/intra-macro data reuse. 2020 IEEE International Solid-State Circuits Conference—(ISSCC) Feb. 16, 2020:234-6.

* cited by examiner $N0 = a_0*w0,0 + a_1*w1,0 + a_2*w2,0 + a_3*w3,0$
$N1 = a_0*w0,1 + a_1*w1,1 + a_2*w2,1 + a_3*w3,1$
$N2 = a_0*w0,2 + a_1*w1,2 + a_2*w2,2 + a_3*w3,2$
$N3 = a_0*w0,3 + a_1*w1,3 + a_2*w2,3 + a_3*w3,3$

MEMORY ARRAY WITH PROGRAMMABLE NUMBER OF FILTERS

CROSS-REFERENCE TO RELATED APPLICATIONS

This application claims the benefit of U.S. Provisional Application Ser. No. 63/222,487, filed on Jul. 16, 2021, entitled "MEMORY ARRAY WITH PROGRAMMABLE NUMBER OF FILTERS," which is hereby incorporated herein by reference in its entirety.

FIELD OF THE DISCLOSURE

This application is generally related to a compute-in-memory (CIM) device, and in particular, related to a CIM device that can perform multiply and accumulate (MAC) operations in neural network computations.

BACKGROUND

Deep learning, machine learning, neural networks, and other matrix-based differentiable programs are used to solve a variety of problems, including natural language processing and object recognition in images. Solving these problems typically involves performing computation based on a matrix-vector multiplication. For example, in a neural network having multiple neurons, input activation values to the neurons may be viewed as an input activation vector, and output activation values from the neurons may be viewed as an output activation vector. The computation of this neural network typically involves a matrix-vector multiplication of the input activation vector with a weight matrix to calculate the output activation vector. In general, a weight matrix can be rectangular and the length of the output activation vector is not necessarily identical from the length of the input activation vector. Computation of a neural network typically involves computation with multiply and accumulate (MAC) operations performed on data values including input/output activation vectors and weights. A MAC operation refers to multiplication between two values, and the subsequent accumulation of results from a sequence of multiplications to provide an output MAC value.

The computation of large and deep neural networks involves massively parallel computation of many different data values. The computation operation such as arithmetic or logic typically is carried out by a processor based on transfer of data between the processor and memory devices such as a memory array. As data throughput requirement increases for massively parallel neural networks, the slower transfer of data of a fast processor with the memory may sometimes become a bottleneck for machine learning applications.

SUMMARY OF THE DISCLOSURE

Aspects of the present disclosure are directed to devices and methods for performing MAC operations using a memory array as a compute-in-memory (CIM) device that can enable higher computational throughput, higher performance and lower energy consumption compared to computation using a processor outside of a memory array. In some embodiments, an activation architecture is provided using a bit cell array arranged in rows and columns to store charges that represent a weight value in a weight matrix. A read word line (RWL) may be repurposed to provide the input activation value to bit cells within a row of bit cells, while a read-bit line (RBL) is configured to receive multiplication products from bit cells arranged in a column. Some embodiments provide multiple sub-arrays or tiles of bit cell arrays.

Some embodiments are directed to a compute-in-memory device that comprises a memory array comprising a plurality of bit cells arranged in a plurality of rows and columns, each bit cell configured to store a weight according to a weight matrix, and to multiply the weight with an input activation of a vector of input activations to generate a product; a plurality of read-word lines (RWLs) each extending along a row direction, each RWL configured to provide an input activation of the vector of input activations to a corresponding row of bit cells; a plurality of read-bit lines (RBLs) each extending along a column direction, each RBL configured to receive products from a corresponding column of bit cells; and one or more adders coupled to the plurality of RBLs and configured to generate a multiply-and-accumulate (MAC) value based on some or all the products received by the plurality of RBLs.

Some embodiments are directed to a method for operating a memory array to perform a multiply-and-accumulate (MAC) operation of a vector of input activations with a weight matrix, wherein the memory array comprises a plurality of bit cells arranged in a plurality of rows and columns. The method comprises storing a plurality of weights in the bit cells within the memory array according to the weight matrix; for each row of the plurality of rows, providing an input activation of the vector of input activations to bit cells within the row using a corresponding read-word line (RWL) that extends along a row direction; multiplying, for each bit cell, the input activation with the weight stored therein to produce a product; for each column of the plurality of columns, receiving products from the corresponding bit cells within the column using a read-bit line (RBL) that extends along a column direction; and generating a MAC value by summing the products using an adder tree coupled to the plurality of RBLs.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear. In the drawings.

DETAILED DESCRIPTION

Figure 1:
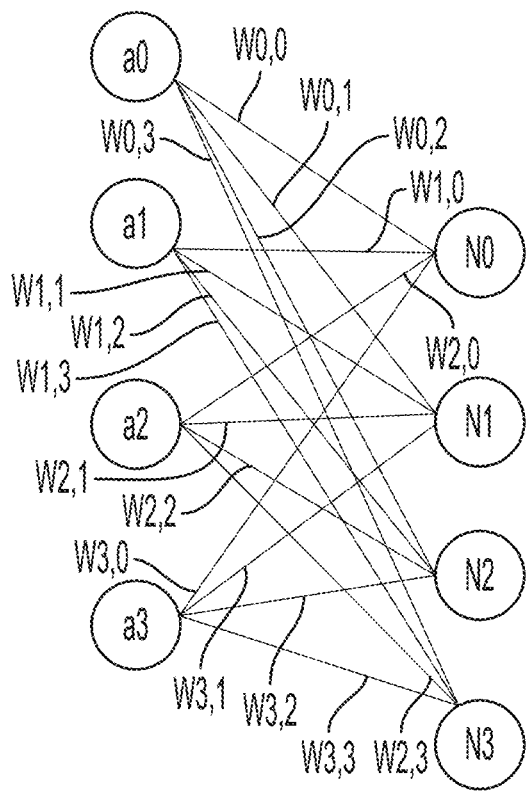
FIG. 1 is a schematic diagram of an exemplary neural network representation illustrating a MAC operation that may be performed using the CIM device disclosed herein.

Disclosed herein are devices and methods for performing MAC operations using a memory array as a compute-in-memory (CIM) device. CIM or in-memory computation is a technique of performing calculations on data using internal circuitry within a memory array without having to send such data to a processor, which can enable higher computational throughput and higher performance compared to computation using a processor outside of a memory array. Because data movement between an external processor and the memory is reduced, CIM may also reduce energy consumption.

Some embodiments are directed to a CIM device with an activation architecture that may be used for MAC operation with a weight matrix in a neural network computation. The weight matrix may be a filter matrix used in deep neural network computations. The size of the weight matrix may be scaled to accommodate different number of neurons and different number of layers in the neural network. In some embodiments, one or more sub-arrays of a memory array may be selectively activated or deactivated to program the CIM device to perform computation of different filter sizes given the same activation input. Such a programmable design may increase flexibility of the CIM device. The ability to deactivate sub-arrays when they are not used may also reduce power consumption of the CIM device.

Some embodiments include a memory array arranged in rows and columns. Each bit cell has a static random-access memories (SRAM) that stores a charge Q that may be used to represent a weight value in a weight matrix. Each bit cell may operate as a multiplier that performs a multiplication between the stored weight to an input activation value applied at a read word line (RWL) in the bit cell array. In such embodiments, the RWL may be repurposed to provide the input activation value to bit cells within the row of bit cells that corresponds to the RWL.

In some embodiments, multiplication products from bit cells may be read out using read-bit lines (RBLs) that extend along a column direction. Each RBL is coupled to bit cells within a column, and is configured to receive products from these bit cells. Each RBL is connected to one or more adders, such as an adder tree which accumulates the products to generate a MAC value. The number of bit cells within a column may be designed to accommodate input activation vectors of different sizes.

Some aspects relate to routing input activation signals to different RWLs. In some embodiments, a routing circuit may be provided adjacent to an edge of the memory array. The routing circuit may have a routing input configured to receive an input activation, and multiple routing outputs coupled to RWLs for different rows of bit cells. In some embodiments, the routing circuit may comprise a demultiplexer.

Some embodiments provide multiple sub-arrays or tiles of bit cell arrays within the memory array. Some aspects relate to routing of input activation signals and output products from multiple sub-arrays. In one embodiment, two routing circuits may be provided to route input activation signals to RWLs in two sub-arrays. In one embodiment, an input multiplexer may be used to route one input activation to one of the sub-arrays via one of the two routing circuits. By using two isolated sub-arrays instead of a single array with a longer column of bit cells coupled to a RBL, device loading effect on the RBL may be reduced, which may improve energy consumption of the CIM device.

In some embodiments, output products from the RBLs may be multiplexed using an interconnect circuit before being provided to the adder tree. As a result, less adder tree connection may be needed compared to the number of RBLs, which could reduce the RBL capacitance and power consumption of the CIM device. In some embodiments, a group of switches are provided to switchably disconnect RBLs in a sub-array to an adder when the sub-array is not active, which could also reduce the RBL capacitance and power consumption of the CIM device. The group of switches may be addressable by using an address signal configured to control the input multiplexer that routes input activations to different sub-arrays.

Some aspects may use an existing foundry design for a memory array of bit cell such as an 8 transistor (8-T) memory array with no or minimal hardware changes, which can lower the cost of design and manufacturing for the disclosed CIM device.

Embodiments disclosed herein may be used for computation of neural networks in an artificial intelligence (AI) application, and some examples are described in detail below. It should be appreciated that the embodiments may also be used for other applications, such as but not limited to image processing, image classification, and identify human face using camera-captured images. In some embodiments, the CIM device is part of a mobile device.

The aspects and embodiments described above, as well as additional aspects and embodiments, are described further below. These aspects and/or embodiments may be used individually, all together, or in any combination of two or more, as the disclosure is not limited in this respect.

FIG. 1 is a schematic diagram of an exemplary neural network representation illustrating a MAC operation that may be performed using the CIM device disclosed herein. FIG. 1 shows an input activation vector (a0, a1, a2, a3) that may represent four input activation values from a $$W = \begin{bmatrix} w0,0 & \cdots & w0,3 \\ \vdots & \ddots & \vdots \\ w3,0 & \cdots & w3,3 \end{bmatrix},$$

previous layer. The neural network applies a weight matrix with each weight $w_{i,j}$ representing a weight for a corresponding input activation and neuron, respectively. The neural network generates an output activation vector (N0, N1, N2, N3) with four output values N0 . . . N3 for four corresponding neurons at the next layer based on a vector-matrix multiplication of the input activation vector with the weight matrix. The vector-matrix multiplication may be performed using a MAC operation.

It should be appreciated that while FIG. 1 illustrates a square 4×4 weight matrix, it is merely for illustrative purposes only and the number of neurons in the previous layer may be different from the number of neurons in the next layer and the input activation vector and output activation vector may have any suitable size and/or dimensions. Furthermore, while FIG. 1 illustrates a single layer of neurons N0-N3, aspects of the present disclosure may also apply to MAC operation for neural network computation involving multiple layers. For example, in a multilayer neural network having layers before the single layer of neurons N0-N3 depicted in FIG. 1, there can be more than one possible weight between the input activation vector (a0, a1, a2, a3) and the neurons N0-N3. Multiple filters may be selected to represent the layers of neurons in between, and each weight of the weight matrix shown in FIG. 1 may be computed using a convolution operation with selected filters, which may also be carried out by an MAC operation using the CIM device disclosed herein. In such an MAC operation, the selected filters may form a weight matrix similar to the weight matrix shown in FIG. 1. Examples of MAC operations on a single layer weight matrix and on a filter convolution are described below with the help of FIGS. 2A and 2B.

Figure 2B:
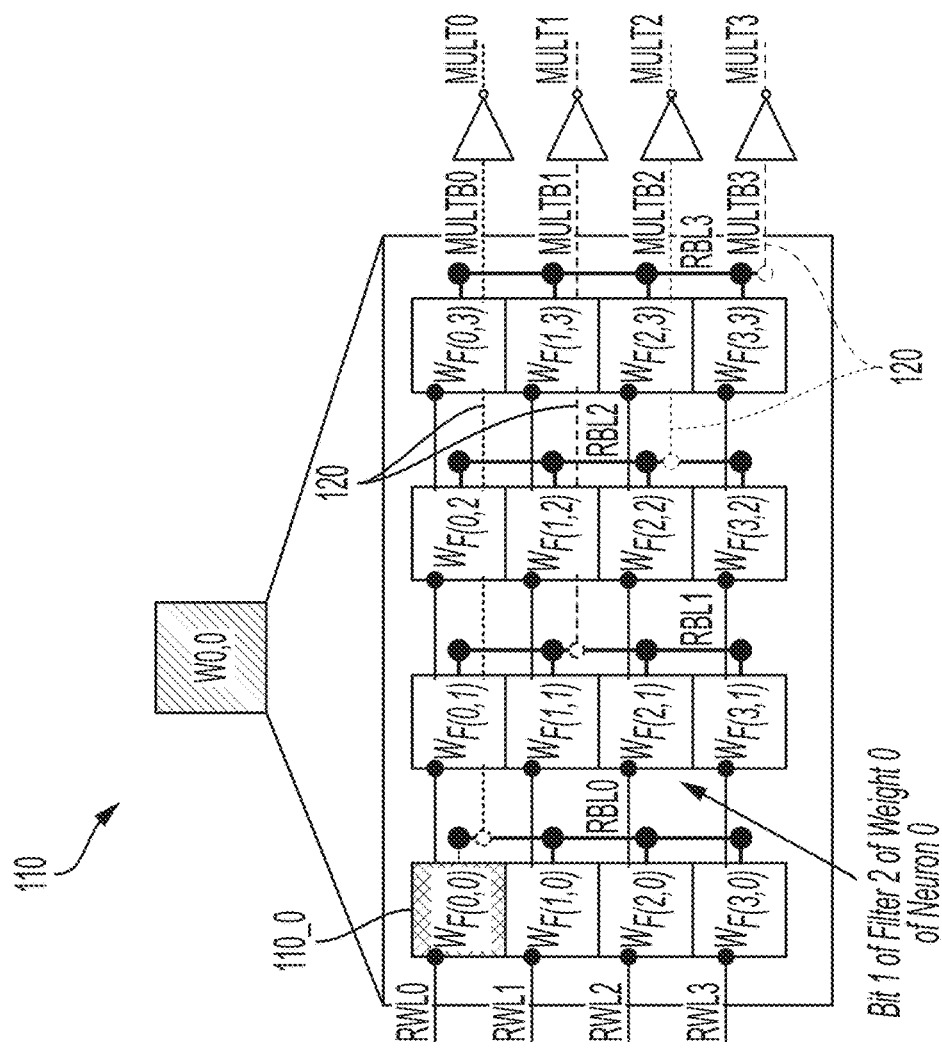
FIG. 2B is a schematic diagram of an exemplary CIM device with a memory array for applying filters to compute weight W0,0 of the weight matrix used in FIG. 2A, in accordance with some embodiments.
Figure 2A:
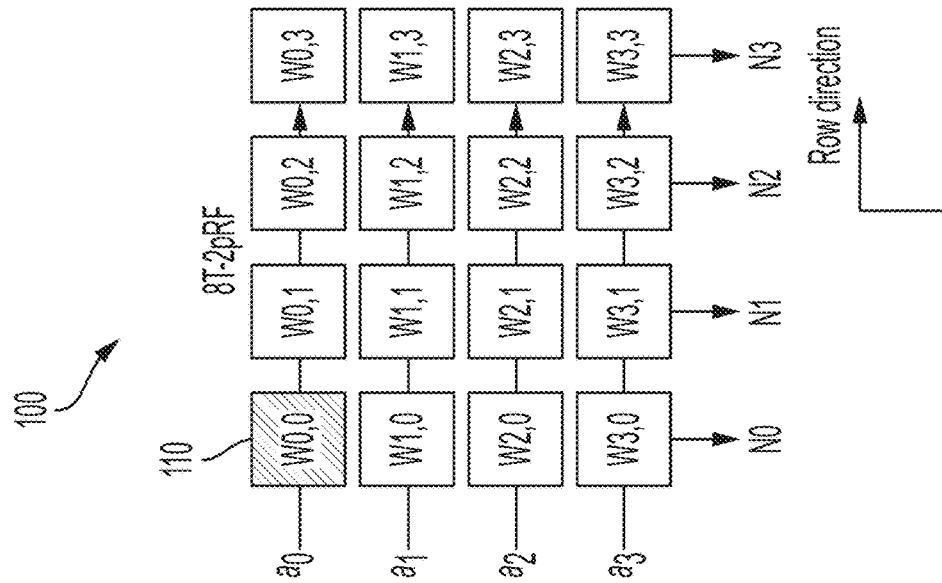
FIG. 2A is a schematic diagram of an exemplary CIM device with a memory array for calculating a single layer neural network as illustrated in FIG. 1, in accordance with some embodiments.

FIG. 2A is a schematic diagram of an exemplary CIM device with a memory array for calculating a single layer neural network as illustrated in FIG. 1, in accordance with some embodiments. FIG. 2A shows a CIM device 100 having an array of bit cells 110 arranged in four columns and four rows. Each row may receive one of four input activations a0, a1, a2, a3. Each of the bit cells are programmed with charges that represent a weight of a 4×4 weight matrix, and is configured to perform a multiplication operation between a received input activation for its row, and a weight stored therein. The product of the multiplication are collected along each column, and accumulated to generate the four output activations for neurons N0, N1, N2, N3, respectively based on the formula as shown in FIG. 1.

FIG. 2B is a schematic diagram of an exemplary memory array for applying filters to compute weight W0,0 of the weight matrix used in FIG. 2A, in accordance with some embodiments. FIG. 2B shows a memory array 110 having an array of bit cells 110_0 arranged in four columns and four rows. Each row may receive input activations from one of a corresponding read-word line RWL0, RWL1, RWL2, RWL3. Each of the bit cells are programmed with a filter value $W_{F(X,Y)}$, where X is the identifier for a filter, Y is the bit number within the filter. For example, $W_{F(2,1)}$ represents a bit 1 of filter 2 to compute weight 0 of neuron 0 (W0,0). In the example shown in FIG. 2B, a 4×4 matrix of filter values are provided, with the four rows each representing one of four 4-bit filters X=(0, 1, 2, 3). The RWLs are used to select from one of the four filters.

Still referring to FIG. 2B, the output products of each bit cell are collected column-wise using one of four read-bit lines RBL0, RBL1, RBL2, RBL3. As shown in FIG. 2B, an output value MULT0 . . . MULT3 corresponding to each respective RBL is routed for further processing using one of four conductors 120. For example, conductors 120 may route output products to an adder tree (not shown).

FIG. 2B is only an example illustrating selection of 4-bit filters for computing W0,0 using a 4×4 bit cell array, while it should be appreciated that the design in FIG. 2B may be extended to any bit size filters by using a memory array 110 having different number of columns. The memory array 110 may also be used to compute any different number of filters by having different number of rows. For example, the memory array 110 may store 4, 8, 16, 32 or any suitable number of filters. Each filter may be 4, 8, 16, 32 or any suitable number of bits.

Figure 3A:
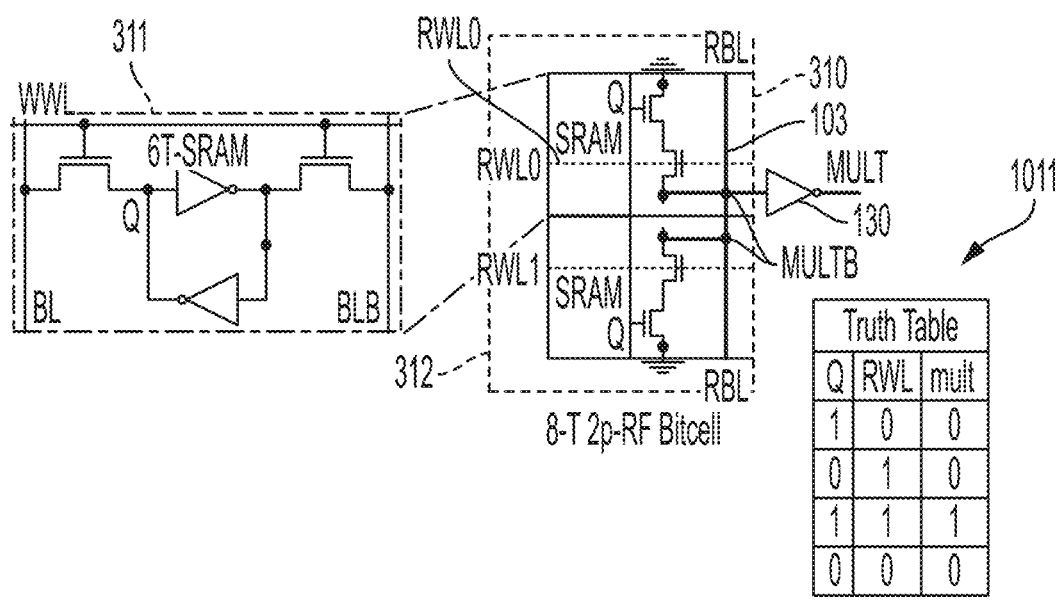
FIG. 3A is a schematic diagram illustrating an exemplary 8-transistor (8-T) memory bit cell that may be used in a CIM device to perform a MAC operation, in accordance with some embodiments.

FIG. 3A is a schematic diagram illustrating an exemplary 8-transistor (8-T) memory bit cell that may be used in a CIM device to perform a MAC operation, in accordance with some embodiments. FIG. 3A shows a bit cell 310 that can be used as bit cell 110_0 in FIG. 2B. Bit cell 310 includes a 6-T SRAM. Although it should be appreciated that any foundry design of a bit cell that is now known or future-developed may also be used for bit cell 310, as aspects of the present disclosure are not so limited. The inventors have recognized and appreciated that the SRAM within bit cell 310 can be operated as an independent multiplier of an input value with the stored charge Q. For example, an inverted output node is coupled to RBL 103 via an inverter 130. As shown in the truth table 1011 in FIG. 3A, inverted output node MULT has a value that represents a product of an input value provided by RWL0 with the weight Q stored in the SRAM of bit cell 310. In some embodiments, a stored charge Q can be used for tapping the weight value. For example, MULT is only 1 when both RWL0 and weight $Q_0$ are 1. Output of the product may be provided by MULT, or it may be routed by the RBL along the column direction.

Figure 3B:
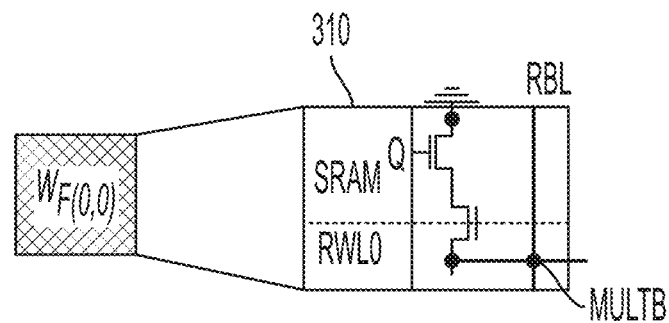
FIG. 3B is a schematic diagram illustrating using a multiplier to apply one bit of a filter such as $W_{F(0,0)}$.

Bit cell 310 may be used to perform MAC operations to compute filter convolution similar to the design shown in FIG. 2B. For example, bit cell 310 may be used as a multiplier to apply one bit of a filter such as $W_{F(0,0)}$ as illustrated in the schematic diagram in FIG. 3B.

Figure 4:
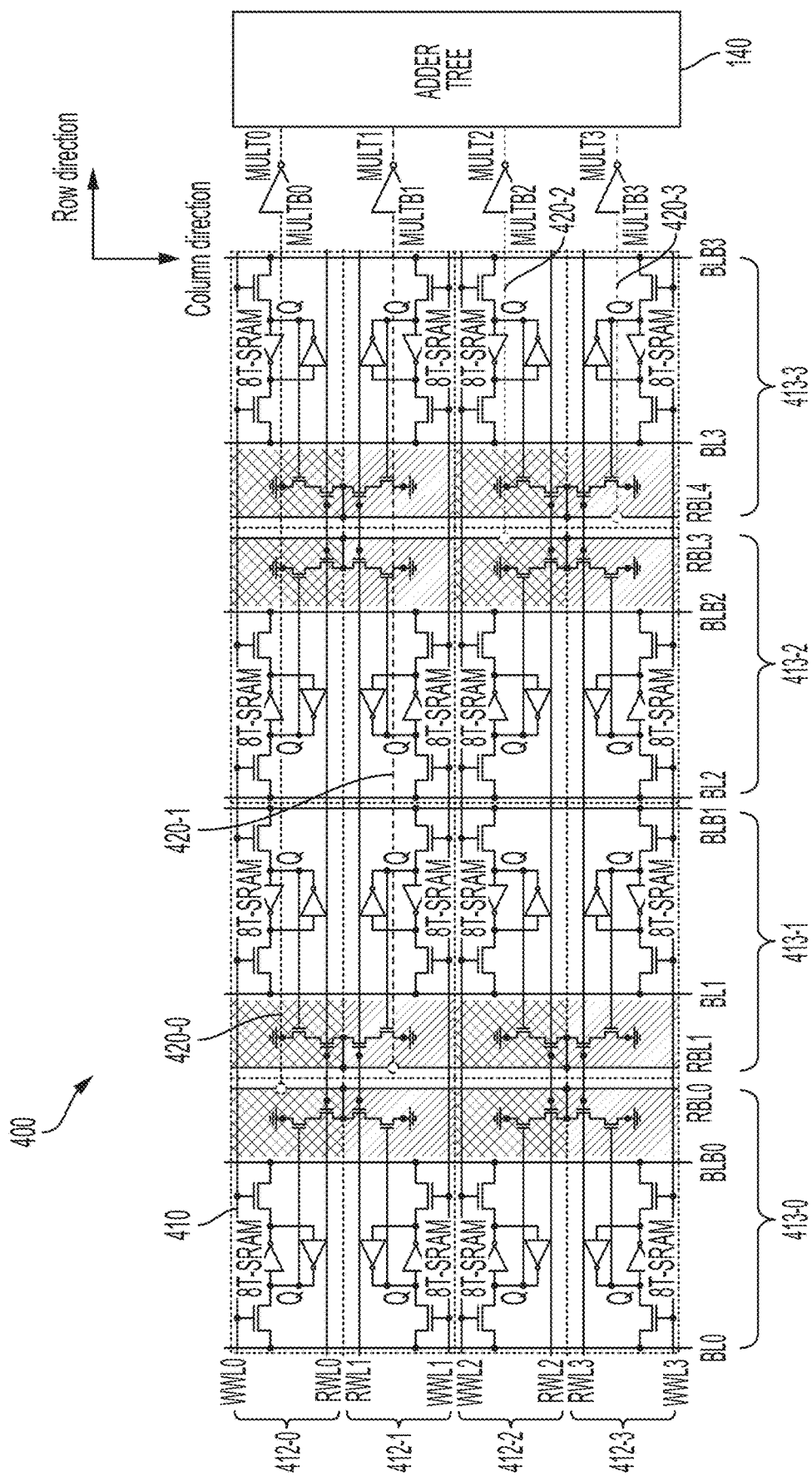
FIG. 4 is a schematic diagram of a CIM device architecture using an array of memory bit cells, in accordance with a first embodiment.

FIG. 4 is a schematic diagram of a CIM device architecture using an array of memory bit cells, in accordance with a first embodiment. FIG. 4 shows a CIM device 400 that includes an array of bit cells 410 arranged in four rows 412-0, 412-1, 412-2, 412-3 and four columns 413-0, 413-1, 413-2, 413-3. Within the first row 412-0, the bit cells are interconnected to RWL0, which extends along the row direction. During operation, each of RWL0, RWL1, RWL2, and RWL3 may serve as activation lines for a corresponding row in rows 412-0, 412-1, 412-2, 412-3 to provide input activation values to bit cells within a row. In one embodiment, input activation values may be provided sequentially, such as in one RWL at a time with the remaining RWL unused or deactivated. Although other uses may be available such as using two or more RWLs in parallel. The timing of activations in the four RWLs may be controlled using any suitable means, such as by an internal or external clock signal. According to one aspect, RWL may perform two functions at the same time: carrying input activation and filtering selection information.

Within the first column 413-0, the four bit cells may store a four-bit value, such as values for a four-bit filter. Bit cells within the first column are interconnected by RBL0, which extends along the column direction. An output activation line 420-0 couples RBL0 to adder tree 140 via an inverter, and provides an inverted output MULT0 to the adder tree 140. Similarly, output activations lines 420-1, 420-2 and 420-3 each interconnects respective RBL1, RBL3 and RBL4 to adder tree 140. The multiplication products on each of the RBLs may be timed in any suitable fashion in coordination with timing of the input activations in the four RWLs. The adder tree 140 may accumulate the received products to generate a MAC value. Adder tree 140 may be implemented in any suitable means now known or future-developed. Although not shown, one or more adders such as a 4-bit adder may be provided to couple MULT0 to adder tree 140.

In some embodiments, output activation lines 420-0, 420-1, 420-2 and 420-3 each extends along the row direction to route signals to the adder tree. To avoid shorting between activation lines 420 and the RBLs, activation line 420 may be implemented as a conductor extending in a metal layer that is in a different plane offset from a plane in which the RBLs are disposed, and parallel to a surface of a semiconductor substrate for the bit cells 410. In one non-limiting example, output activation lines 420 are disposed in the M3 metal layer, while inter-layer interconnection structures such as vias are provided to couple output activation lines 420 with corresponding RBLs. In embodiments where bit cell 410 is reusing an existing foundry memory bit cell design, output activation lines 420 may be added without significantly adding cost or complexity to the circuit design of the overall memory array.

In other embodiments, output activation lines 420s may be absent, such that there is no need to provide additional routing in a metal layer above the bit cells to route output from the RBLs. In such embodiments, signals from the RBLs may be routed along the column direction rather than along the row direction. For example, a routing circuit may be disposed below the bit cell columns for this purpose.

The memory based CIM device 400 may provide several advantages. The CIM array architecture is highly scalable to provide flexibility for application across different technical generations with different matrix and vector size requirements. For example, while FIG. 4 illustrates a MAC operation with an 4×4 weight matrix, the CIM device 400 may be extended to accommodate any size of weight matrices. For example, by adding 4 more rows of bit cell, a 8×4 weight matrix can be used to compute for example 8 filters. Similarly, a 4×8 weight matrix may be used to compute an 8-bit filter by extending each of the four rows to have 8 columns. A high number of multiplier units may be provided based on any suitable SRAM read/write circuit architecture now known or future-developed to benefit from a high memory density of a bit cell array. Scaling may be provided, for example, by using more bit cell columns and rows within an array, and/or by using tiling of sub-arrays as described below.

Figure 5:
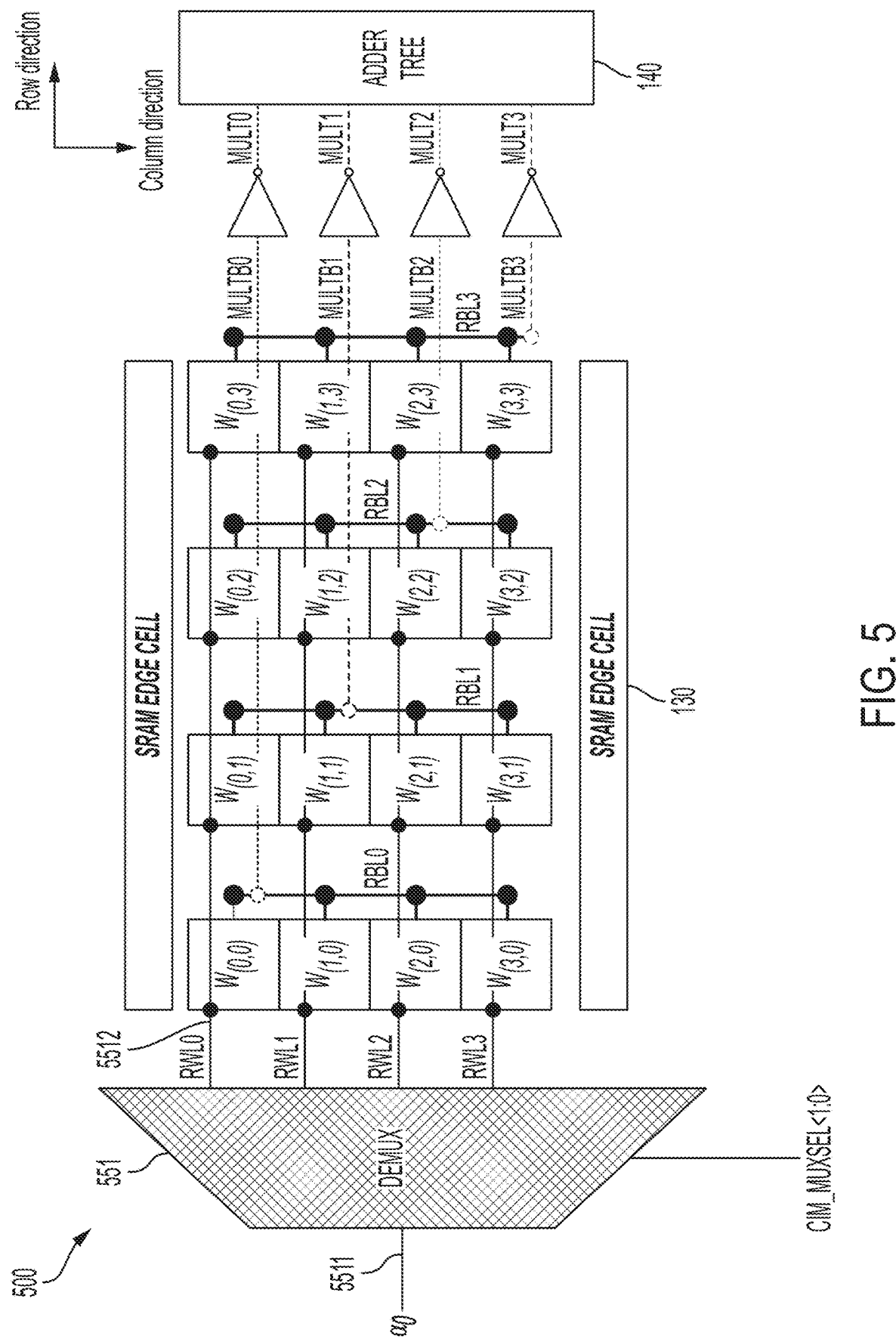
FIG. 5 is a schematic diagram of a CIM device architecture that is a variation of the CIM device shown in FIG. 4, in accordance with a second embodiment.

FIG. 5 is a schematic diagram of a CIM device architecture that is a variation of the CIM device shown in FIG. 4, in accordance with a second embodiment. FIG. 5 shows a CIM device 500 that is similar to CIM device 400 in many aspects, with like components designated with the same reference numbers. CIM device 500 differs from CIM device 400 in that a routing circuit 551 is provided with a routing input 5511 that receives input activation a0, and four routing outputs 5512 that each is coupled to one of RWL0, RWL1, RWL2 and RWL3 to selectively route the input activation a0 to one of the four RWLs based on a control signal CIM_MUXSEL<1:0>. In the example shown in FIG. 5, the routing circuit 551 is a demultiplexer.

FIG. 5 also illustrates the loading of 4-bit weights of a weight matrix stored in each of the bit cells. During operation, one of the four RWLs may be activated at a time based on the outputs of demultiplexer 551. In one example, each row of bit cells is used to store weights from one filter or weights from one layer. Therefore CIM device 500 may be used to compute four filters. Each filter for a row has four bits that are stored within bit cells of each of the four columns. The architecture in FIG. 5 may be scaled with more columns and/or rows added to provide computation for higher number of filters and/or filters with higher number of bits.

CIM device 500 also includes static random-access memories (SRAM) edge cells 130 below the fourth row of bit cells, and above the first row of bit cells. Edge cells 130 may provide electrical isolation between the four rows of bit cells shown in FIG. 5 from additional circuitry such as additional rows of bit cells in a different tile positioned above and/or below the four rows as shown in FIG. 5.

Figure 6:
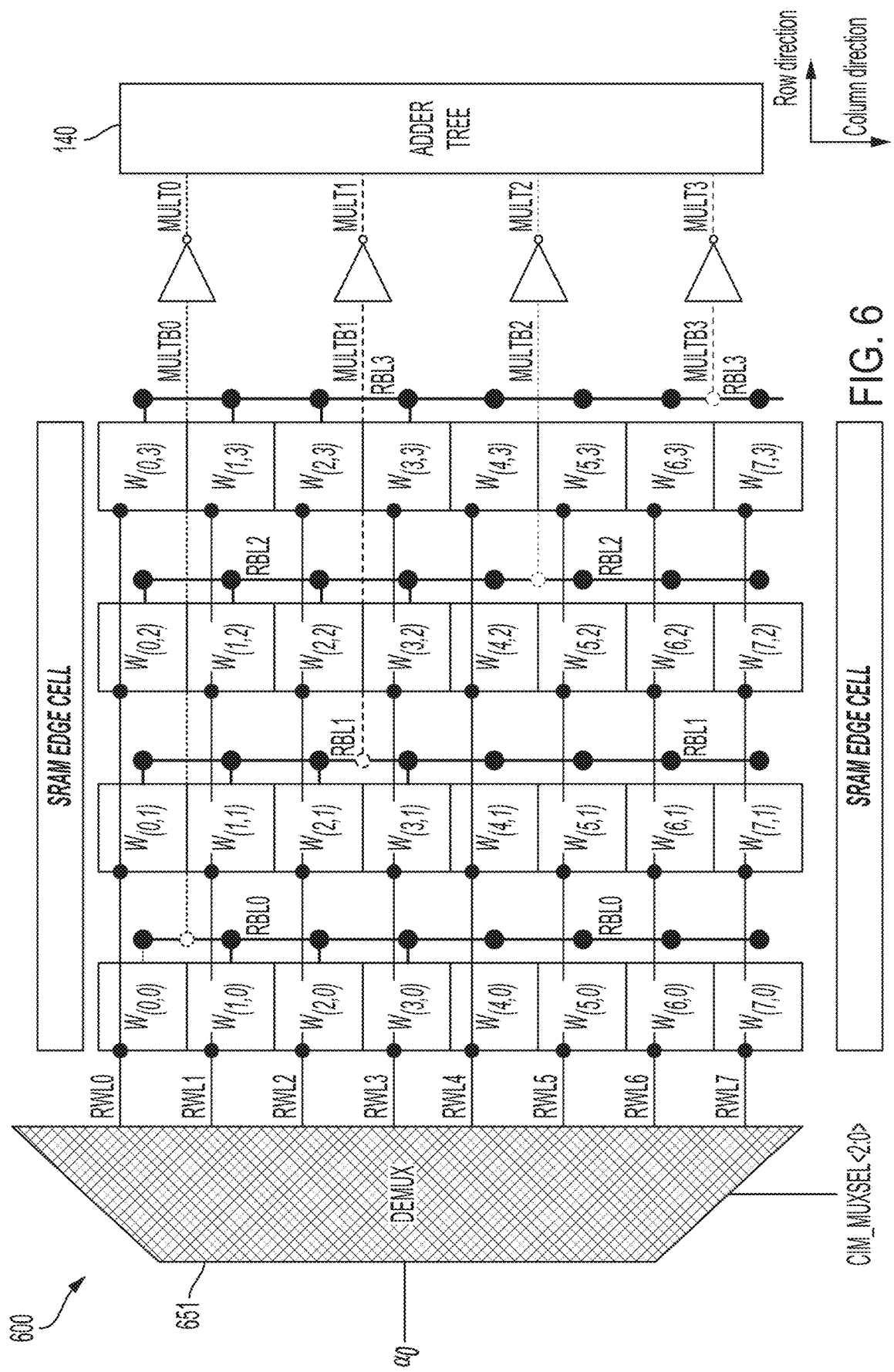
FIG. 6 is a schematic diagram of a CIM device architecture that is a variation of the CIM device shown in FIG. 5, in accordance with a third embodiment.

FIG. 6 is a schematic diagram of a CIM device architecture that is a variation of the CIM device shown in FIG. 5, in accordance with a third embodiment. FIG. 6 shows a CIM device 600 that is similar to CIM device 500 in many aspects, with like components designated with the same reference numbers. CIM device 600 differs from CIM device 400 in that eight rows, rather than 4 rows of bit cells are provided. The extra rows may be used to scale up the number of filters or weights that can be used in computation. Each row may store a 4-bit weight from one filter or layer. The demultiplexer 651 may activate one of the 8 RWLs to route an input activation a0 in accordance with a control signal CIM_MUXSEL<2:0>.

Figure 7:
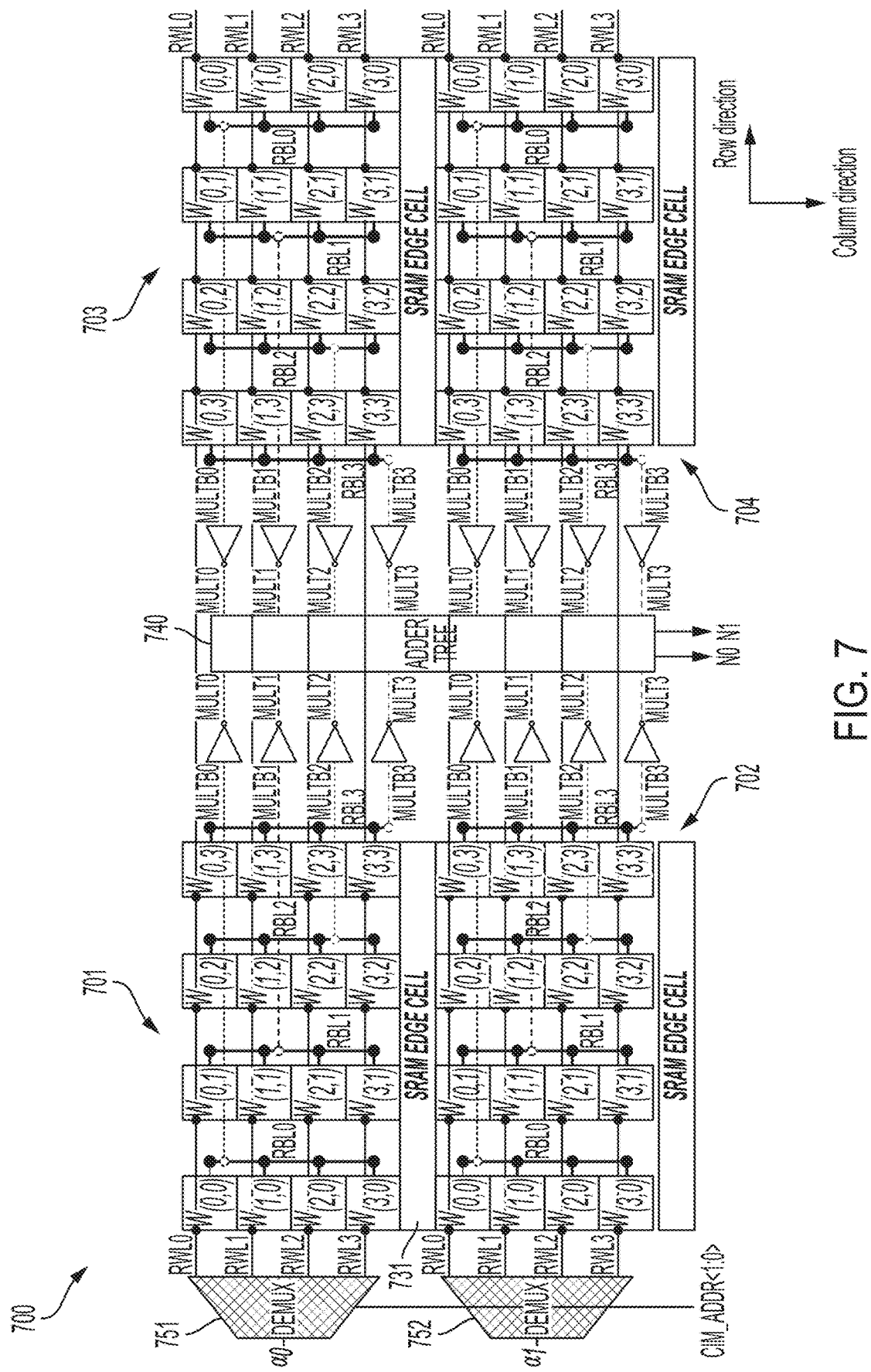
FIG. 7 is a schematic diagram of a CIM device architecture having sub-arrays or tiles, in accordance with a fourth embodiment.

FIG. 7 is a schematic diagram of a CIM device architecture having sub-arrays or tiles, in accordance with a fourth embodiment. In FIG. 7, CIM device 700 includes sub-arrays 701 and 702 adjacent each other and aligned along the column direction. CIM device 700 also includes sub-arrays 703 and 704 aligned with sub-arrays 701, 702, respectively, along the row direction.

As shown, each of sub-arrays 701 and 702 is loaded with an independent weight matrix with 4-bit weights. Two demultiplexers 751, 752 are provided in CIM device 700. First demultiplexer 751 is coupled to the four RWLs in the first sub-array 701, while second demultiplexer 752 is coupled to the four RWLs in the second sub-array 702. The first demultiplexer 751 may be used to route a first activation input $a_0$ to one of the four RWLs in the first sub-array 701 in accordance with an address signal CIM_ADDR<1:0>. The second demultiplexer 752 may be used to route a second activation input a1 to one of the four RWLs in the second sub-array 702 in accordance with the address signal CIM_ADDR<1:0>.

Third sub-array 703 is positioned such that the adder tree 740 is disposed between the first sub-array 701 and third sub-array 703. As shown, input activations in third sub-array 703 are provided by the same RWLs that are coupled to the first sub-array 701. Because adder tree 740 is shared by both sub-arrays 701 and 703, less adder components are required to perform CIM operations for both sub-arrays which can increase the area utilization efficiency of circuits on the semiconductor substrate. In some embodiments, the adder tree can be shared by using time multiplexing or time sharing.

Referring back to FIG. 6, each RBL connects 8 bit cells to the adder tree. When the 8 bit cells in a column are switching during operation, CIM device 600 may consume more electric power compared to the CIM device 500 in FIG. 5 due to a larger device loading. The larger device loading may be caused, for example, by each RBL being capacitively coupled to 8 bit cells rather than 4 bit cells at a time in CIM device 600.

The inventors have recognized and appreciated that by breaking down a column of multiple weights or filters into isolated sub-arrays, device loading may be reduced and power consumption may be reduced.

Figure 8:
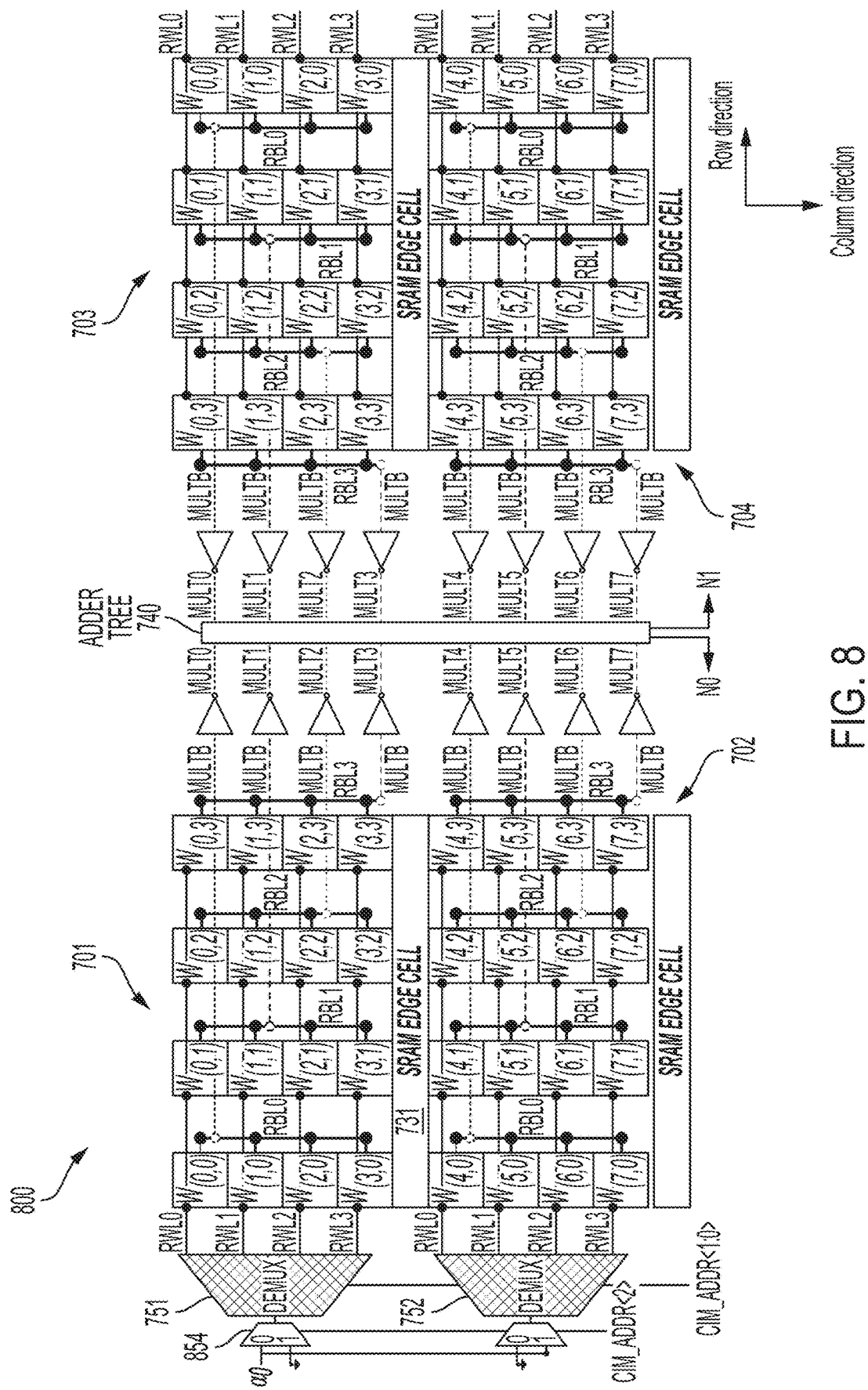
FIG. 8 is a schematic diagram of a CIM device architecture having sub-arrays with a multiplexed activation input, in accordance with a fifth embodiment.

FIG. 8 is a schematic diagram of a CIM device architecture having sub-arrays with a multiplexed activation input, in accordance with a fifth embodiment. FIG. 8 shows a CIM device 800 that is similar to CIM device 700 in many aspects, with like components designated with the same reference numbers. CIM device 800 differs from CIM device 700 in that input multiplexer 854 that is controllable in accordance with a second address signal CIM_ADDR<2> to route an input activation a0 to routing inputs of one of two demultiplexers 751, 752. Namely, the second address signal CIM_ADDR<2> specifies whether the input activation should be routed to the top four rows or the bottom four rows of bit cells. The 4×4 sub-arrays 701 and 702 are loaded with weights or filters that representing 8 filters or 8 weights. The first two address signals CIM_ADDR<1:0> may be used to route the input activation to one of the four RWLs within the two sub-arrays. Yet, sub-array 701 is isolated from sub-array 702 by an SRAM edge cell 731 disposed between the bottom row of sub-array 701 and the top row of sub-array 702. As a result, each RBL in either sub-array 701 or 702 is only coupled to 4 bit cells in a column, and device loading on the RBL is reduced compared to that in FIG. 6 for computation with eight rows or eight weights/filters.

The architecture in FIG. 8 may be further expanded to activate one of 16 or 32 filters by adding additional sub-arrays and demultiplexers.

Figure 9:
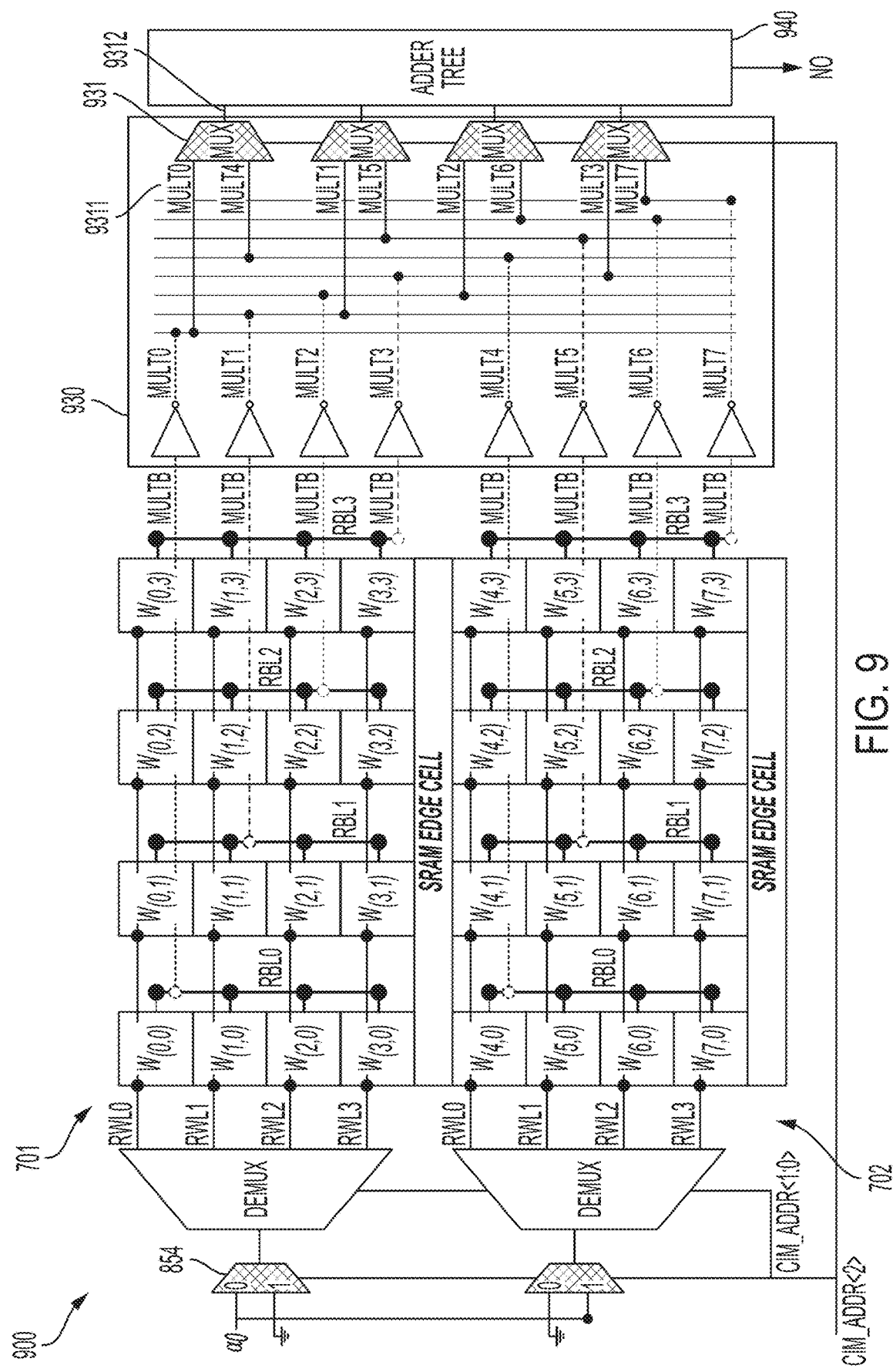
FIG. 9 is a schematic diagram of a CIM device architecture with an interconnect circuit, in accordance with a sixth embodiment.

FIG. 9 is a schematic diagram of a CIM device architecture with an interconnect circuit, in accordance with a sixth embodiment. FIG. 9 shows a CIM device 900 that is similar to CIM device 800 in certain aspects, with like components designated with the same reference numbers. CIM device 900 includes an interconnect circuit 930 that comprises a plurality of output multiplexers 932 that route eight MULT signals received at inputs to the output multiplexers 932 to one of the four outputs 9312 to be provided to the adder tree 940. As a result, only half the number of input connections to adder tree 940 is required. For example, adder tree 940 may comprise four adders that each corresponds to one multiplexer output 9312, as opposed to needing eight adders in adder tree 740 of FIG. 8 to receive the products from sub-arrays 701 and 702. As shown FIG. 9, the output multiplexers 931 may be controlled by the same address signal CIM_ADDR<2> that are provided to input multiplexer 854 to selectively activate one of the two sub-arrays 701, although it should be appreciated that any suitable multiplexing scheme may be used to reduce the number of adder input requirements to the adder tree. By multiplexing the output products, the complexity and circuit area efficiency of the adder tree 940 may be advantageously improved.

Figure 10:
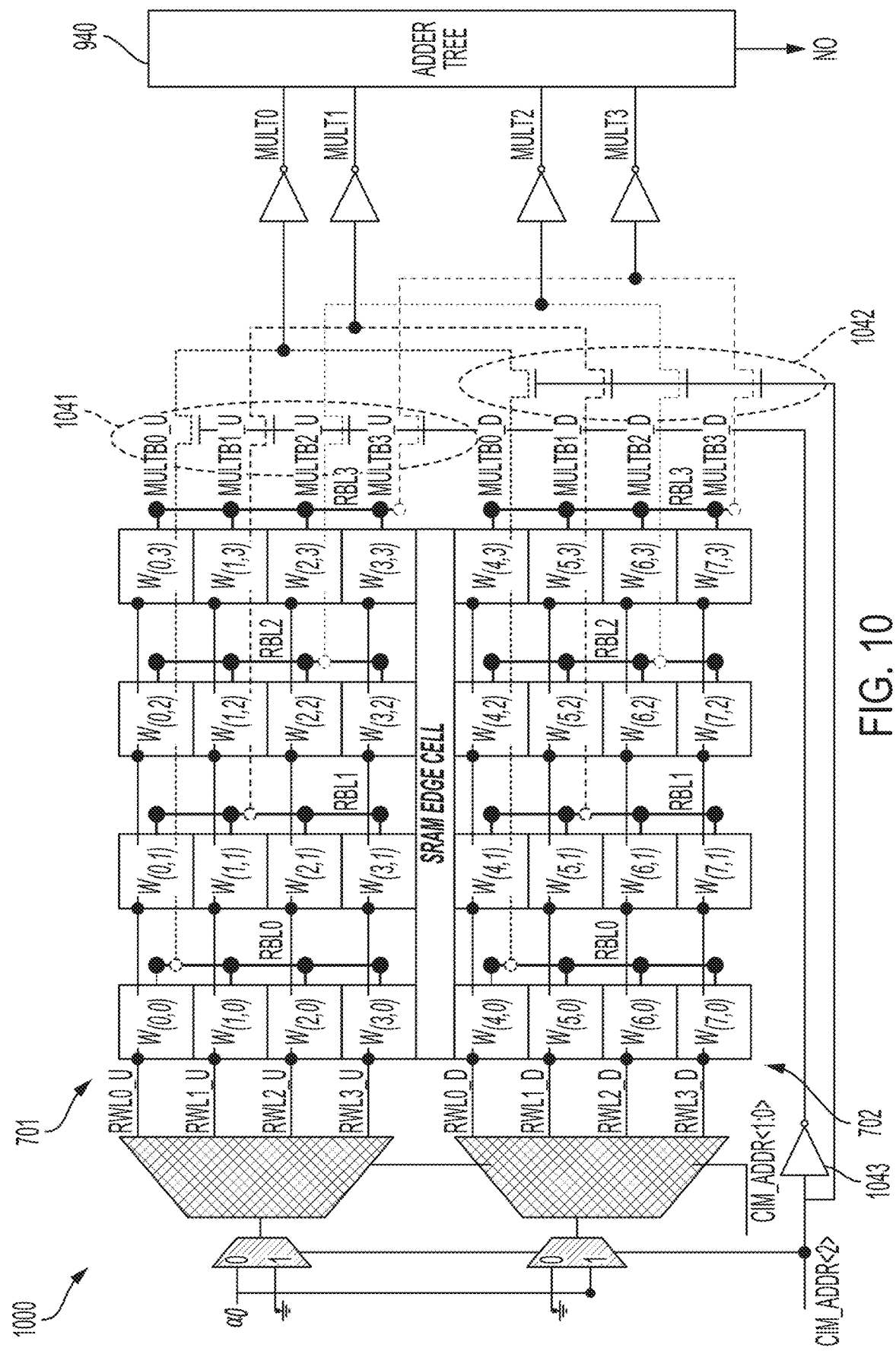
FIG. 10 is a schematic diagram of a CIM device sub-array architecture with adder multiplexing between rows of sub-arrays, in accordance with a seventh embodiment.

FIG. 10 is a schematic diagram of a CIM device sub-array architecture with adder multiplexing between rows of sub-arrays, in accordance with a seventh embodiment. FIG. 10 shows a CIM device 1000 that is similar to CIM device 900 in many aspects, with like components designated with the same reference numbers. CIM device 1000 differs from CIM device 900 in that a first group of switches 1041 are provided that each switchably couples a corresponding RBL in the first sub-array 701 to the adder tree 940; and that a second group of switches 1042 are provided that each switchably couples a corresponding RBL in the second sub-array to the adder tree. As shown in FIG. 10, each switch in the first group of switches 1041 is disposed within a circuit path from a corresponding RBL of the first sub-array 701 to the adder tree 940. The switches may be implemented in any suitable fashion, such as but not limited to metal-oxide silicon field effect transistors (MOSFETs). In a non-limiting example, the switches are NMOS.

Only one group of the first and second groups of switches 1041, 1042 are open at a time, with the other group of switches closed. This may be implemented, as shown in FIG. 10, by controlling switching of group 1042 based on the address signal CIM_ADDR<2>, and controlling switching of group 1041 based on an inverted CIM_ADDR<2> via inverter 1043, such that the two groups of switches open or close in opposite phase relative to each other. As a result, the two groups of switches act as an alternative multiplexing scheme that may save circuit area compared to the interconnect circuit 930 in FIG. 9. For example, by eliminating interconnect circuit 930 in FIG. 10, no multiplexer 931 is required.

As another advantage, when a group of switches are turned off, for example when a corresponding sub-array is not selected by CIM_ADDR<2>, the switches disconnect RBLs in the sub-array from the adder tree, which may reduce the RBL capacitance and power consumption of the CIM device.

Figure 11:
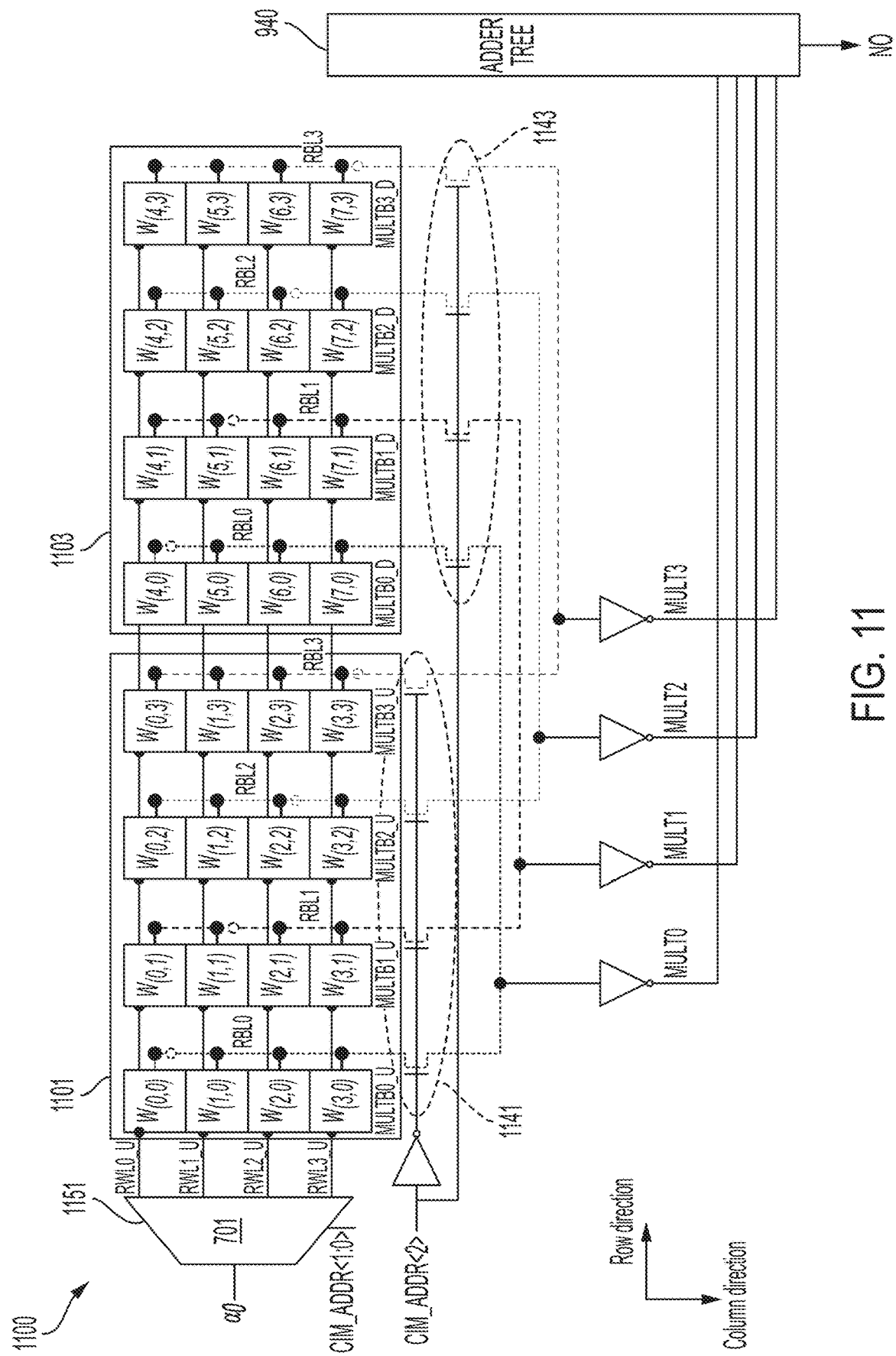
FIG. 11 is a schematic diagram of a CIM sub-array architecture with adder multiplexing between columns of sub-arrays, in accordance with an eighth embodiment.

FIG. 11 is a schematic diagram of a CIM sub-array architecture with adder multiplexing between columns of sub-arrays, in accordance with an eighth embodiment. FIG. 9 shows a CIM device 1100 that is similar to CIM device 1000 in many aspects, with like components designated with the same reference numbers. Like CIM device 1000, CIM device 1100 also is loaded with 8 filters of 4-bits each, although CIM device 1100 differs from CIM device 1000 in that two sub-arrays 1101, 1103 are disposed side-by-side along the row direction and sharing the same RWLs for input activations.

In contrast to CIM device 400 in FIG. 4, the output RBLs of CIM device 1100 are not routed to the adder tree using horizontal conductors 420 that overlap with the memory array. Instead, the RBLs for sub-array 1101 and 1103 are routed below the sub-arrays along the column direction before being interconnected to the adder tree 940. Therefore CIM device 1100 can be implemented without requiring vertical vias and conductors 420 to be added in different metal layers to provide interconnection.

CIM device 1100 provides a different demultiplexing scheme to select one of the 8 filters than CIM device 1000. As shown in FIG. 11, a first address signal CIM_ADDR<1:0> controls demultiplexer 1151 to route input activation a0 to RWL on one of the four rows. Selection between the two sub-arrays are further performed via a second address signal CIM_ADDR<2> which controls opening and closing of a first group of switches 1141 and a second group of switches 1143. Switches in group 1141 are provided that each switchably couples a corresponding RBL in the first sub-array 1101 to the adder tree 940; and switches in group 1142 are provided that each switchably couples a corresponding RBL in the second sub-array 1103 to the adder tree. As shown in FIG. 11, each switch in the first group of switches 1141 is disposed within a circuit path from a corresponding RBL of the first sub-array 1101 to the adder tree 940. The switches may be implemented in any suitable fashion, such as but not limited to metal-oxide silicon field effect transistors (MOS-FETs). In a non-limiting example, the switches are NMOS.

Only one group of the first and second groups of switches 1141, 1143 are open at a time, with the other group of switches closed. This may be implemented, as shown in FIG. 11, by controlling switching of group 1143 based on the address signal CIM_ADDR<2>, and controlling switching of group 1141 based on an inverted CIM_ADDR<2> via an inverter such that the two groups of switches open or close in opposite phase relative to each other. As a result, the two groups of switches act as a multiplexing scheme for selectively disconnecting RBLs in a sub-array from the adder tree. As a result, RBL capacitance may be reduced and power consumption of the CIM device 1100 may be reduced.

Figure 12:
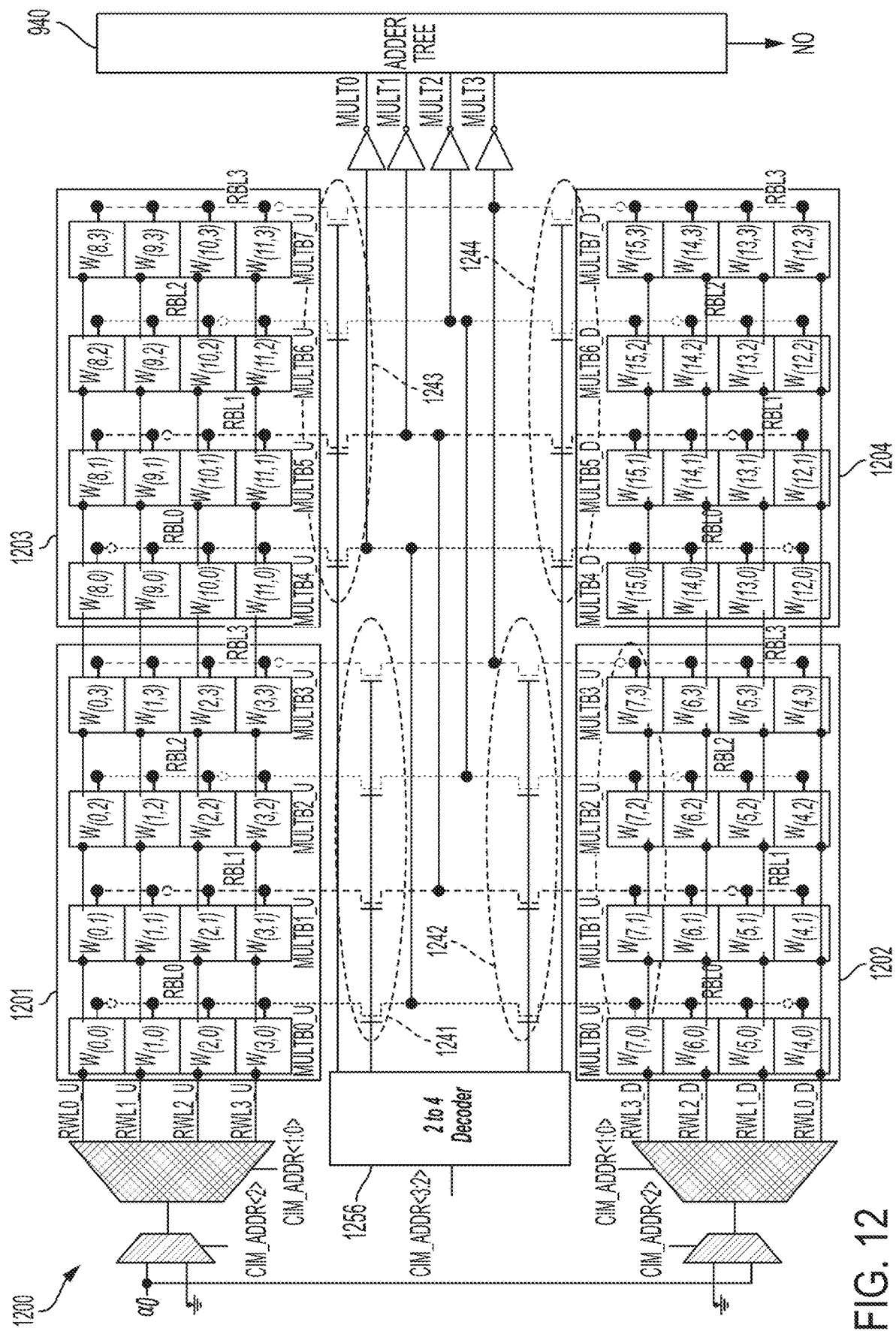
FIG. 12 is a schematic diagram of a CIM device sub-array architecture with adder multiplexing in both columns and rows of sub-arrays, in accordance with a nineth embodiment.

FIG. 12 is a schematic diagram of a CIM device sub-array architecture with adder multiplexing in both columns and rows of sub-arrays, in accordance with a nineth embodiment. FIG. 12 shows a CIM device 1200 that is similar to CIM device 1100 in many aspects, with like components designated with the same reference numbers. CIM device 1200 differs from CIM device 1100 in that four sub-arrays 1201, 1202, 1203 and 1204 are provided. A decoder 1256 controls switching of four groups of switches 1241, 1242, 1243, 1244 based on an address signal CIM_ADDR<3:2> to select one out of the four sub-arrays to route output products from the RBLs in the selected sub-array to adder tree 940. The architecture in FIG. 12 is an expansion of the CIM device 1100 to provide computation with 16 filters, and may be further extended to 32, or 64 filters by further expansions to include more sub-arrays.

Figure 13:
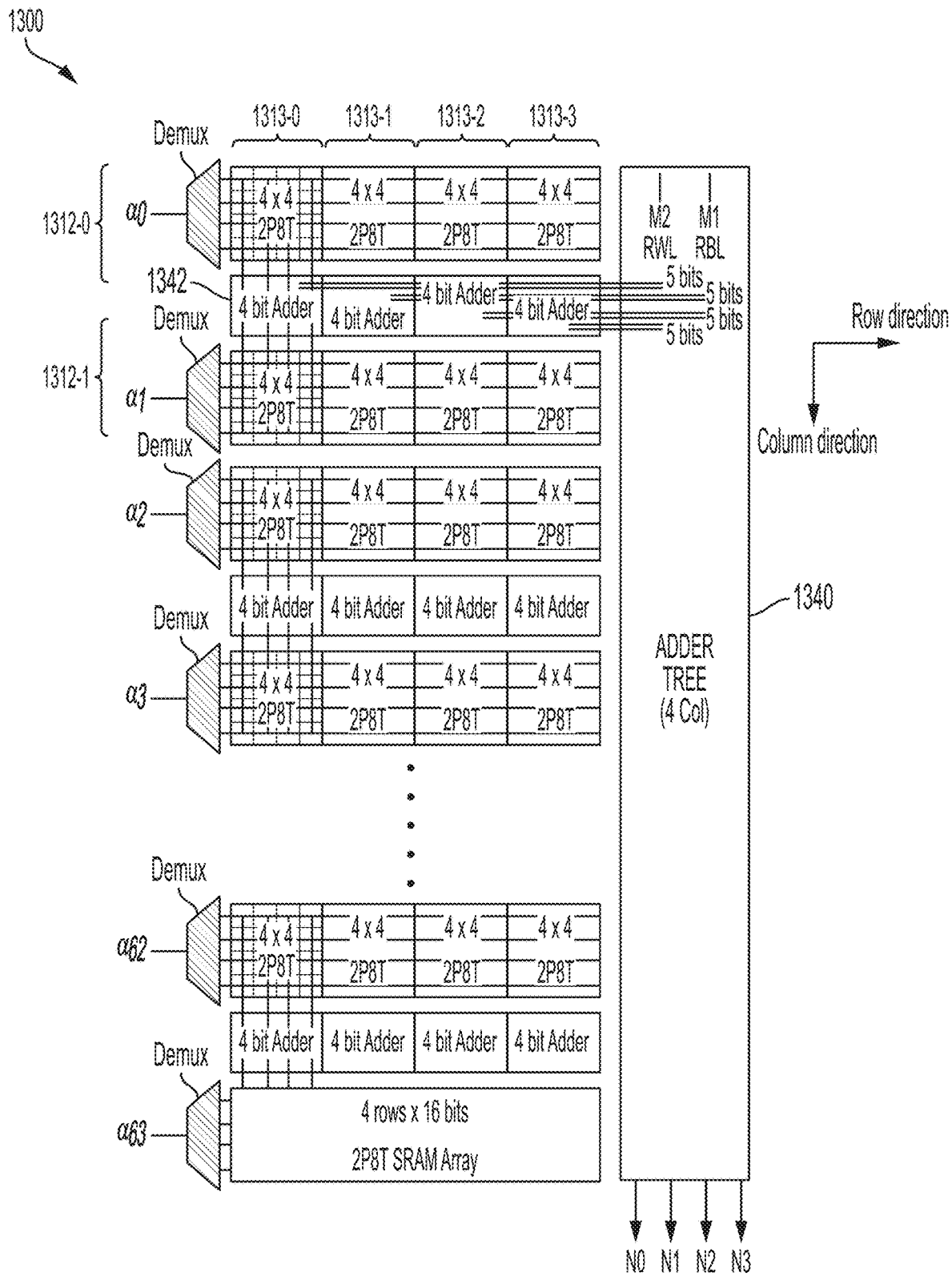
FIG. 13 is a schematic diagram of a CIM device sub-array architecture with multiple columns of sub-arrays abutting each other, in accordance with a tenth embodiment.

FIG. 13 is a schematic diagram of a CIM device sub-array architecture with multiple columns of sub-arrays abutting each other, in accordance with a tenth embodiment. FIG. 9 shows a CIM device 1300 that has four columns 1313-0, 1313-1, 1313-2, 1313-3 that abut each other along the row direction. Each sub-array within a column is a 4×4 bit cell array arrange in a row that shares demultiplexed RWLs to provide input activation, similar to CIM device 1200 in FIG. 12. Four 4-bit adders 1342 are provided below the first row 1312-0 and above the second row 1312-1. The adders 1342 abut each other along the row direction, in for example a sliced or interleaved fashion to provide products representing four neurons N0, N1, N2 and N3. Because the adders 1342 separate rows of bit cells above and below, there is no SRAM edge cell required between abutting sub-arrays within a same row, or between sub-arrays representing adjacent neurons. As a result, the CIM device 1300 may provide better area utilization efficiency of circuits on the semiconductor substrate on which CIM device 1300 is implemented.

Figure 14:
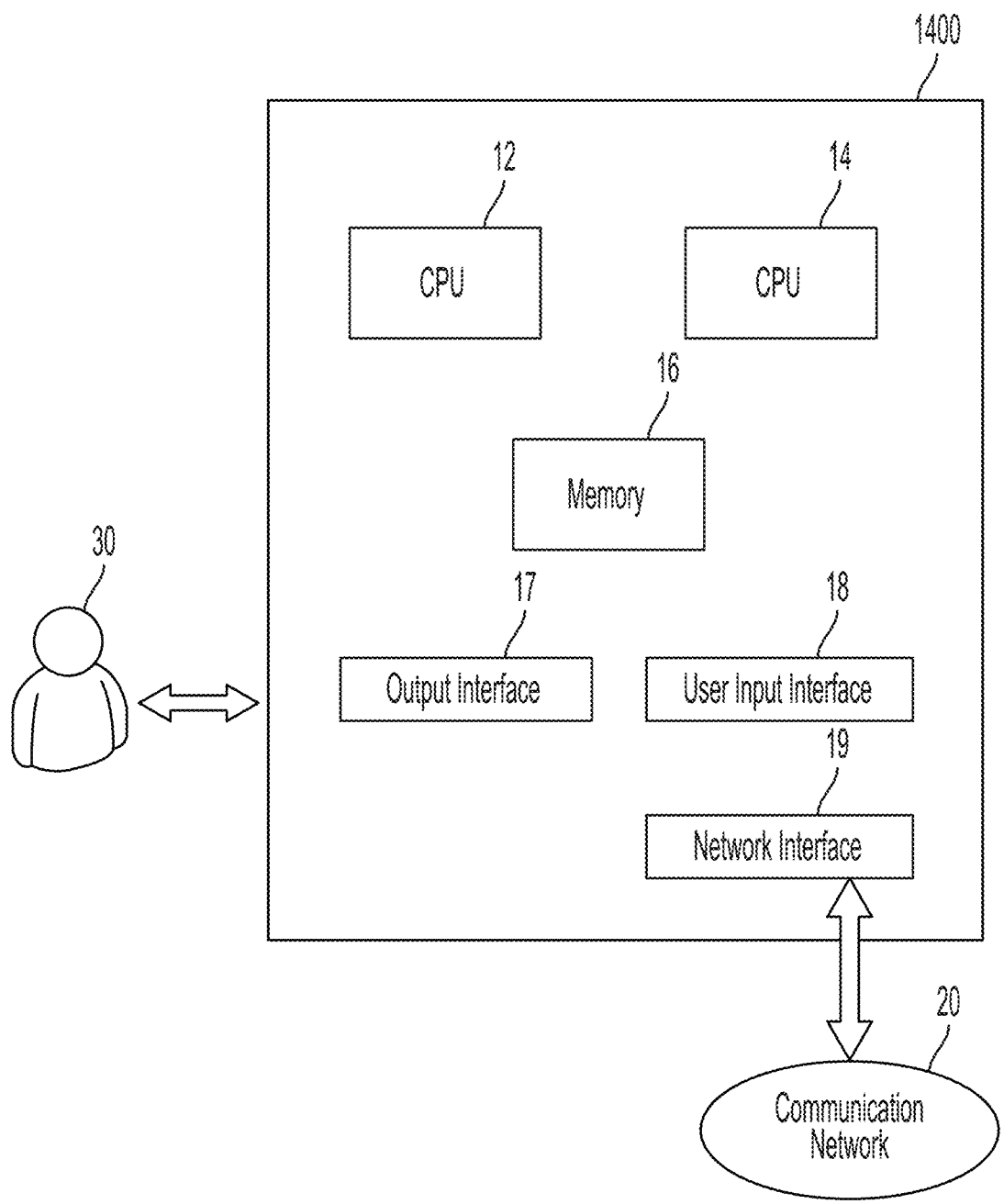
FIG. 14 is a high level block diagram that shows an illustrative computing device 1400 in which some embodiments can be practiced.

FIG. 14 is a high level block diagram that shows an illustrative computing device 1400 in which some embodiments can be practiced. In FIG. 14, computing device 1400 may be a desktop computer, a server, or a high-performance computing system such as a machine learning accelerator. Computing device 1400 may also be a portable, handheld, or wearable electronic device. Computing device 1400 may in some embodiments be a smartphone, a personal digital assistance (PDA), tablet computer, a smartwatch. Computing device 10 may be powered by a battery such as a rechargeable battery. Computing device 10 may also be a general purpose computer, as aspects of the present application are not limited to a portable device or a battery-powered device. Computing device 1400 may be a CIM device that can perform MAC operations according to any of the embodiments disclosed herein.

Computing device 1400 includes a central processing unit (CPU) 12 having one or more processors, a graphics processing unit (GPU) 14 having one or more graphics processors, and a non-transitory computer-readable storage medium 16 that may include, for example, volatile and/or non-volatile memory. The memory 16 may store one or more instructions to program the CPU 12 and/or GPU 14 to perform any of the functions described herein. Memory 16 may comprise one or more TCAM bit cell array that may perform MAC operation according to the disclosure above. Memory 16 may further include routing circuitry and one or more memory controllers configured to route input activation values and program operation of the adder tree.

The computing device 10 may have one or more input devices and/or output devices, such as user input interface 18 and output interface 17 as illustrated in FIG. 14. These devices can be used, among other things, to present a user interface. Examples of output interface that can be used to provide a user interface include printers or display screens for visual presentation of output, speakers or other sound generating devices for audible presentation of output, and vibratory or mechanical motion generators for presentation of tactile output. Examples of input interface that can be used for a user interface include keyboards and pointing devices, such as mice, touch pads, or digitizers for pen, stylus or finger touch input. As another example, the input interface 18 may include one or more microphones for capturing audio signals, one or more cameras and light sensors to capture visual signals, and the output interface 17 may include a display screen for visually rendering, and/or a speaker for audibly rendering, images or text to a user 30 of the computing device 10.

Also as shown in FIG. 14, the computing device 10 may comprise one or more network interfaces 19 to enable communication via various networks (e.g., the network 20). Examples of networks include a local area network or a wide area network, such as an enterprise network or the Internet. Such networks may be based on any suitable technology and may operate according to any suitable protocol and may include wireless networks, wired networks or fiber optic networks. Examples of network interfaces include Wi-Fi, WiMAX, 3G, 4G, 5G NR, white space, 802.11x, satellite, Bluetooth, near field communication (NFC), LTE, GSM/WCDMA/HSPA, CDMA1x/EVDO, DSRC, GPS, etc.) While not shown, computing device 10 may additionally include one or more high speed data buses that interconnect the components as shown in FIG. 14, as well as a power subsystem that provide electric power to the components.

The aspects and embodiments described above, as well as additional aspects and embodiments, are described further below. These aspects and/or embodiments may be used individually, all together, or in any combination of two or more, as the application is not limited in this respect.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A compute-in-memory device, comprising:
   a memory array comprising a plurality of bit cells arranged in a plurality of rows and columns, each bit cell configured to store a weight according to a weight matrix, and to multiply the weight with an input activation of a vector of input activations to generate a product, wherein the memory array comprises a first sub-array and a second sub-array;
   a plurality of read-word lines (RWLs) each extending along a row direction, each RWL configured to provide an input activation of the vector of input activations to a corresponding row of bit cells;
   a plurality of read-bit lines (RBLs) each extending along a column direction, each RBL configured to receive products from a corresponding column of bit cells; and
   one or more adders coupled to the plurality of RBLs and configured to generate a multiply-and-accumulate (MAC) value based on some or all the products received by the plurality of RBLs, wherein the one or more adders comprise an adder tree;
   wherein the first sub-array and the second sub-array are aligned along the column direction, and each RBL to which the first sub-array is connected is isolated from any RBL to which the second sub-array is connected; or
   wherein the first sub-array and the second sub-array are aligned along the row direction, and the first sub-array and the second sub-array are not connected to the adder tree at a same time.

2. The compute-in-memory device of claim 1, further comprising a plurality of inverters, wherein each RBL of the plurality of RBLs is coupled to the one or more adders via a corresponding inverter of the plurality of inverters.

3. The compute-in-memory device of claim 1, wherein the plurality of bit cells within the array are 8-transistor (8-T) bit cells.

4. The compute-in-memory device of claim 1, wherein the memory array is configured to receive a vector of input activations and a matrix of weights.

5. The compute-in-memory device of claim 1, wherein:
   each RWL is configured to provide an input activation of a vector of input activations to the corresponding row of bit cells, and
   the MAC value is based on a vector product between the vector of input activations and the weight matrix.

6. The compute-in-memory device of claim 1, further comprising
   a routing circuit having a routing input configured to receive an input activation, and a plurality of routing outputs coupled to the some or all of the plurality of RWLs, the routing circuit configured to route input activations to some or all of the plurality of RWLs.

7. The compute-in-memory device of claim 6, wherein the routing circuit comprises a demultiplexer.

8. The compute-in-memory device of claim 1, further comprising
   a static random-access memories (SRAM) edge cell disposed alongside a row of the plurality of rows of bit cells.

9. The compute-in-memory device of claim 1, wherein the memory array comprises the first sub-array and the second sub-array aligned with the first sub-array along the column direction, and the compute-in-memory device further comprises:
   a first routing circuit having a routing input and a plurality of routing outputs coupled to some or all of the plurality of RWLs in the first sub-array;
   a second routing circuit having a routing input and a plurality of routing outputs coupled to some or all of the plurality of RWLs in the second sub-array.

10. The compute-in-memory device of claim 9, further comprising:
    one or more input multiplexer that are controllable to route an input activation to the routing input of the first routing circuit or the routing input of the second routing circuit.

11. The compute-in-memory device of claim 10, further comprising:
    an interconnect circuit that couples the plurality of RBLs in the first sub-array and the second sub-array to the adder tree, wherein the interconnect circuit comprises one or more output multiplexers.

12. The compute-in-memory device of claim 11, wherein the one or more output multiplexers and the one or more input multiplexers are configured to receive a same address signal and are addressable based on the address signal.

13. The compute-in-memory device of claim 1, further comprising:
    a first group of switches each switchably couples a corresponding RBL in the first sub-array to the adder tree;
    a second group of switches each switchably couples a corresponding RBL in the second sub-array to the adder tree, wherein
    the first group of switches are configured to open or close in opposite phase relative to the second group of switches.

14. The compute-in-memory device of claim 1, wherein the first group of switches are switchable based on an address signal, and the second group of switches are switchable based on an inverted version of the address signal.

15. The compute-in-memory device of claim 1, further comprising a decoder coupled to the first group of switches and the second group of switches, the decoder configured to receive an address signal and to control switching of the first group of switches and the second group of switches based on the address signal.

16. The compute-in-memory device of claim 1, wherein the memory array comprises the first sub-array and the second sub-array aligned with the first sub-array along the row direction, and
the adder tree is disposed between the first sub-array and the second sub-array and is coupled to some or all RBLs of the first sub-array and to some or all RBLs of the second sub-array.

17. The compute-in-memory device of claim 1, wherein the memory array comprises a plurality of sub-arrays arranged in a plurality of rows and columns, wherein the plurality of sub-arrays within each row abut each other.

18. The compute-in-memory device of claim 17, wherein the one or more adders comprises:
an adder disposed between two adjacent rows of sub-arrays; and
the adder tree coupled to the adder by an interconnect extending along the row direction.

19. The compute-in-memory device of claim 1, wherein the one or more adders are coupled to the plurality of RBLs via one or more conductors that each extends along the row direction.

20. The compute-in-memory device of claim 19, wherein the one or more conductors are disposed in a first plane that is parallel but offset from a second plane in which the plurality of RBLs are disposed.

21. A method for operating a memory array to perform a multiply-and-accumulate (MAC) operation of a vector of input activations with a weight matrix, wherein the memory array comprises a plurality of bit cells arranged in a plurality of rows and columns, the method comprising:
storing a plurality of weights in the bit cells within the memory array according to the weight matrix, wherein the memory array comprises a first sub-array and a second sub-array;
for each row of the plurality of rows, providing an input activation of the vector of input activations to bit cells within the row using a corresponding read-word line (RWL) that extends along a row direction;
multiplying, for each bit cell, the input activation with the weight stored therein to produce a product;
for each column of the plurality of columns, receiving products from the corresponding bit cells within the column using a read-bit line (RBL) that extends along a column direction; and
generating a MAC value by summing the products using an adder tree coupled to the plurality of RBLs;
wherein the first sub-array and the second sub-array are aligned along the column direction, and each RBL to which the first sub-array is connected is isolated from any RBL to which the second sub-array is connected; or
wherein the first sub-array and the second sub-array are aligned along the row direction, and the first sub-array and the second sub-array are not connected to the adder tree at a same time.

22. The method of claim 21, wherein generating the MAC value comprises generating a vector product between the vector of input activations and the weight matrix.

23. The method of claim 21, further comprising:
routing an input activation, with a demultiplexer, to a RWL of the plurality of RWLs.

24. The method of claim 21, further comprising:
switchably couple one of a first group of RBLs in the first sub-array or a second group of RBLs in the second sub-array to the adder tree based on an address signal.

25. The method of claim 24, further comprising:
selectively routing an input activation to one of the first sub-array or the second sub-array based on the address signal.

* * * * *